US009899321B1

(12) United States Patent
Park et al.

(10) Patent No.: US 9,899,321 B1
(45) Date of Patent: Feb. 20, 2018

(54) METHODS OF FORMING A GATE CONTACT FOR A SEMICONDUCTOR DEVICE ABOVE THE ACTIVE REGION

(71) Applicant: GLOBALFOUNDRIES Inc., Grand Cayman (KY)

(72) Inventors: Chanro Park, Clifton Park, NY (US); Ruilong Xie, Niskayuna, NY (US); Min Gyu Sung, Latham, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/373,691

(22) Filed: Dec. 9, 2016

(51) Int. Cl.
*H01L 21/28* (2006.01)
*H01L 23/528* (2006.01)
*H01L 23/522* (2006.01)
*H01L 21/768* (2006.01)
*H01L 29/66* (2006.01)
*H01L 29/417* (2006.01)

(52) U.S. Cl.
CPC .......... *H01L 23/528* (2013.01); *H01L 21/28* (2013.01); *H01L 21/28114* (2013.01); *H01L 21/28123* (2013.01); *H01L 21/7684* (2013.01); *H01L 23/5226* (2013.01); *H01L 29/41775* (2013.01); *H01L 29/66553* (2013.01)

(58) Field of Classification Search
None
See application file for complete search history.

(56) References Cited

U.S. PATENT DOCUMENTS

| | | | | |
|---|---|---|---|---|
| 2004/0099957 | A1* | 5/2004 | Jin | H01L 21/76831 257/774 |
| 2004/0140486 | A1* | 7/2004 | Lee | H01L 21/31144 257/208 |
| 2016/0027888 | A1* | 1/2016 | Ekbote | H01L 27/088 257/384 |
| 2016/0049482 | A1* | 2/2016 | Liu | H01L 21/283 257/288 |
| 2016/0141207 | A1* | 5/2016 | Hung | H01L 23/485 438/286 |
| 2017/0047254 | A1* | 2/2017 | Fan | H01L 21/76897 |
| 2017/0141215 | A1* | 5/2017 | Ching | H01L 29/66795 |

* cited by examiner

*Primary Examiner* — Asok K Sarkar
(74) *Attorney, Agent, or Firm* — Amerson Law Firm, PLLC

(57) ABSTRACT

One illustrative method disclosed includes, among other things, completely forming a first conductive structure comprising one of a conductive gate contact structure (CB) or a conductive source/drain contact structure (CA), wherein the entire conductive gate contact structure (CB) is positioned vertically above a portion of an active region of a transistor device, and, after completely forming the first conductive structure, completely forming a second conductive structure comprising the other of the conductive gate contact structure (CB) or the conductive source/drain contact structure (CA).

25 Claims, 16 Drawing Sheets

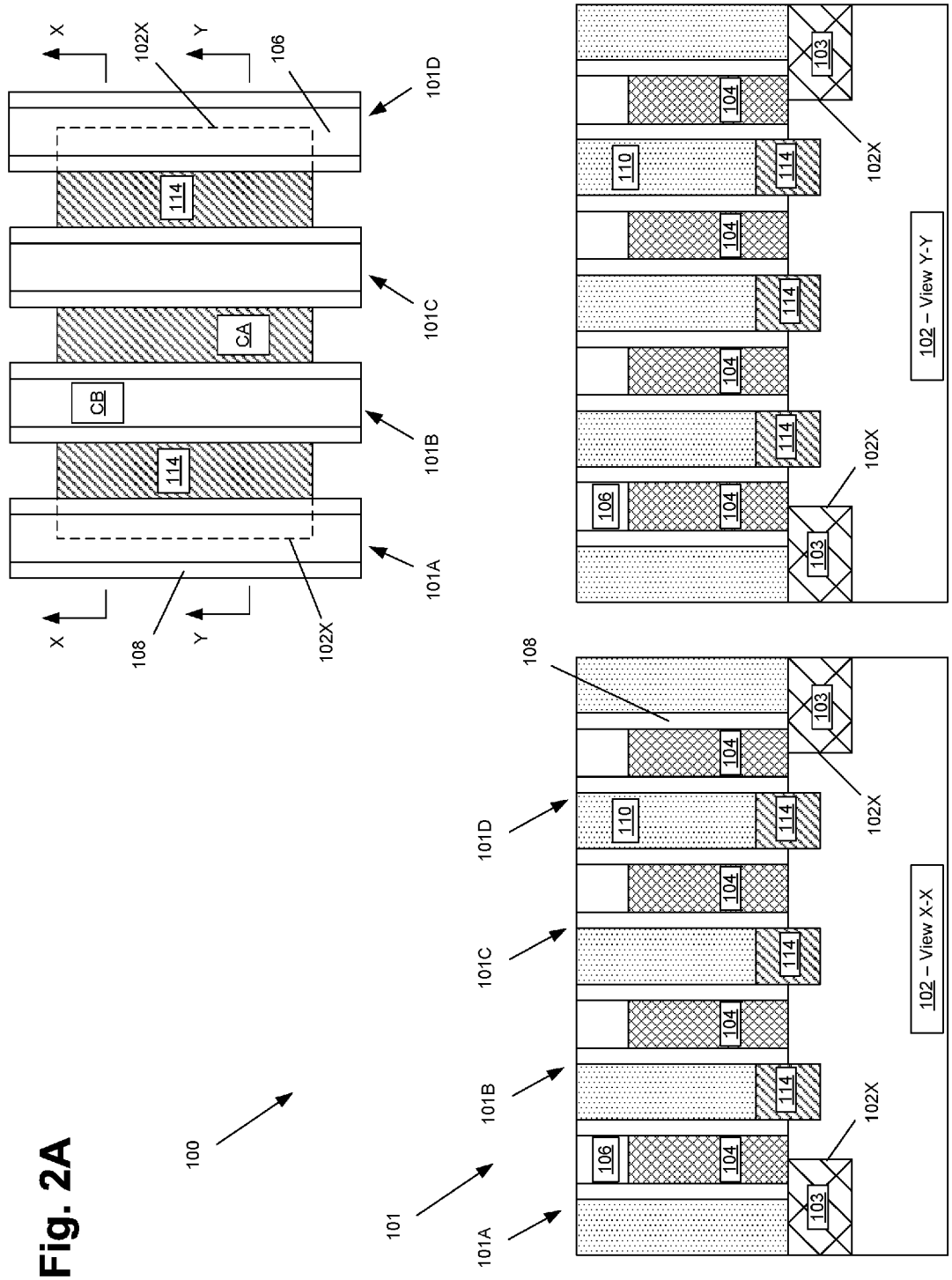

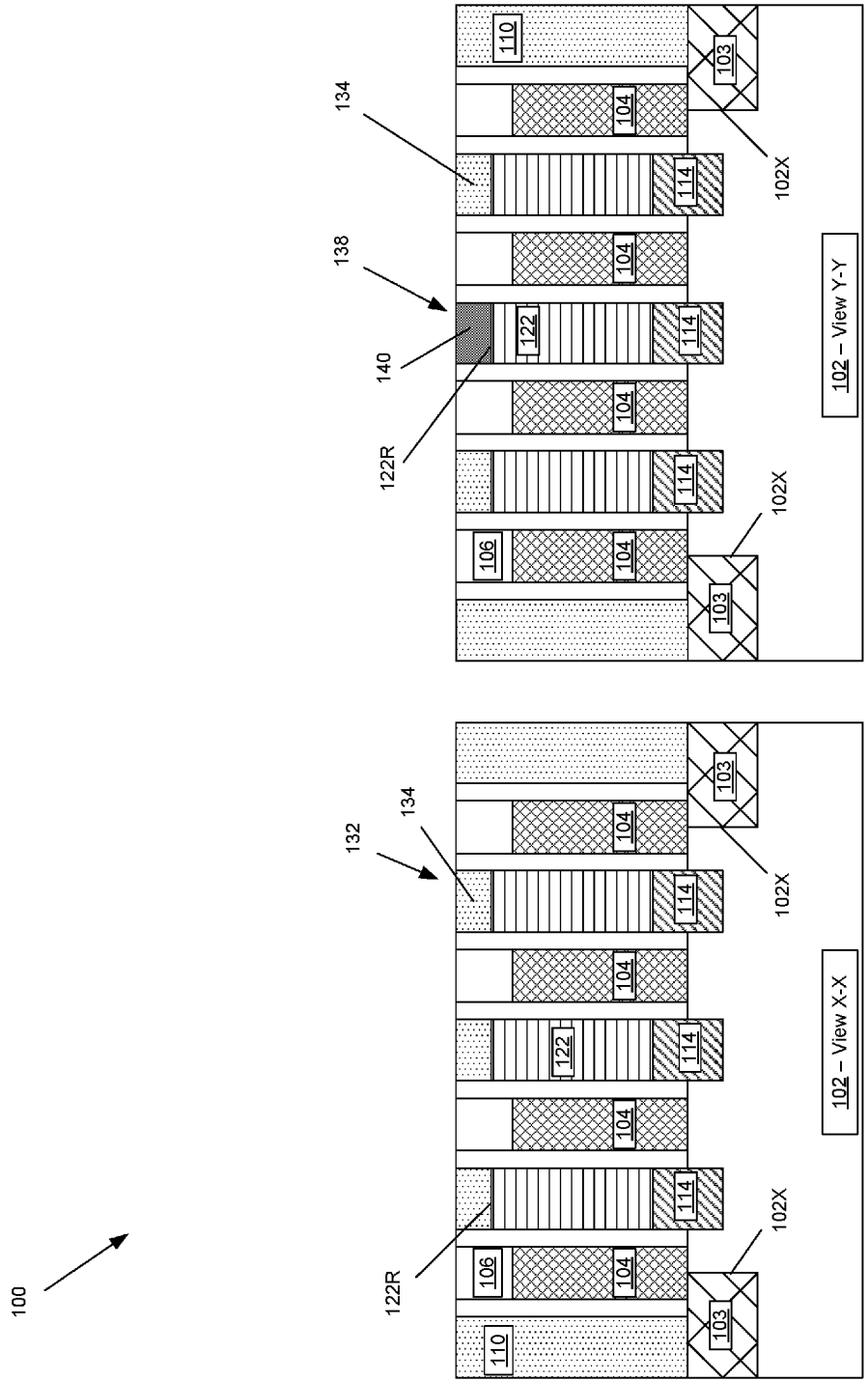

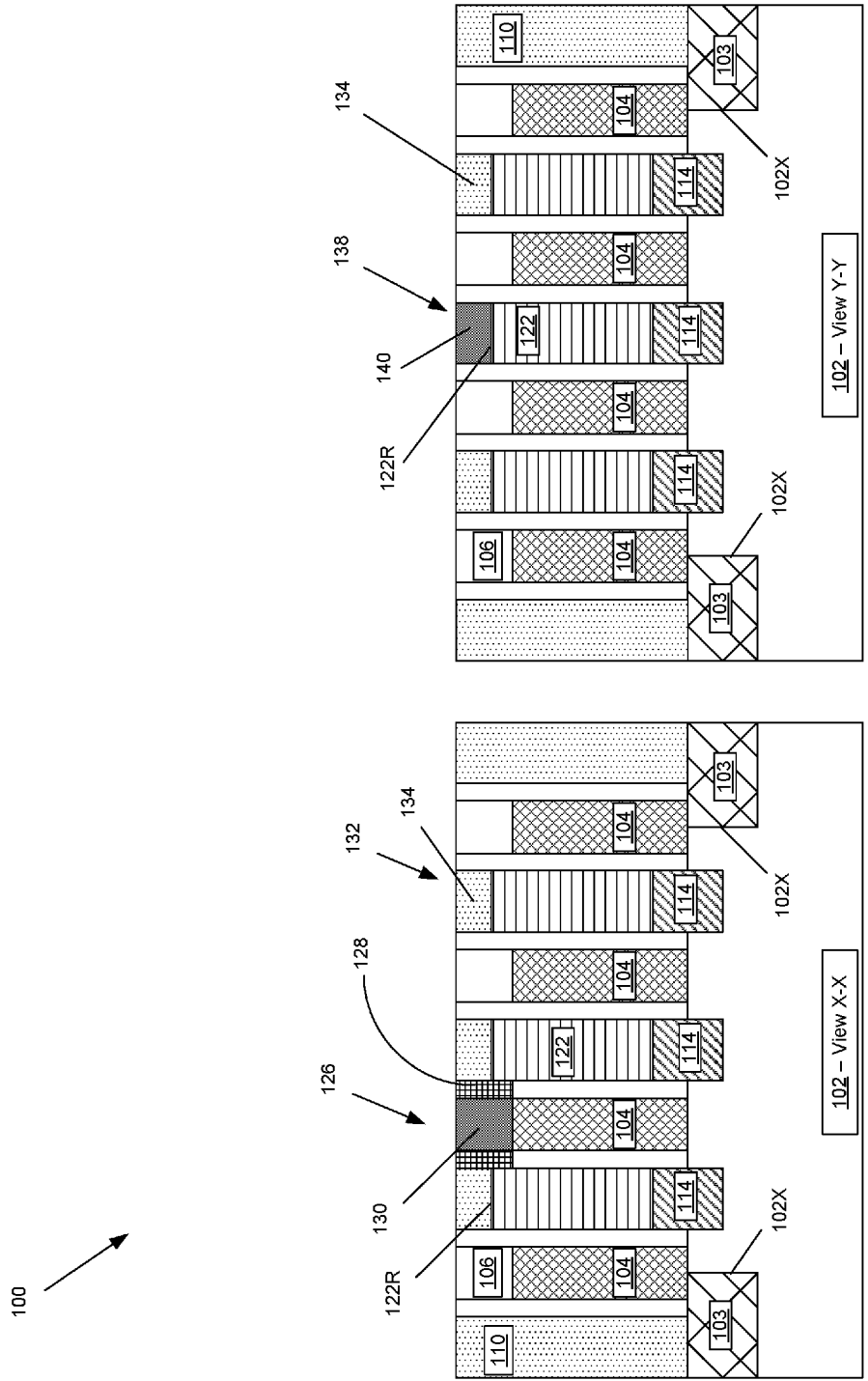

METHODS OF FORMING A GATE CONTACT FOR A SEMICONDUCTOR DEVICE ABOVE THE ACTIVE REGION

BACKGROUND OF THE INVENTION

1. Field of the Invention

The present disclosure generally relates to the fabrication of integrated circuits, and, more particularly, to various methods of forming a gate contact for a semiconductor device above the active region and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16, which is sometimes referred to as a "CB contact" structure, that is formed so as to establish electrical contact to the gate structure of the transistor device. As shown in FIG. 1B, the CB gate contact 16 is typically positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation (dielectric) layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric materials, have been formed above the substrate 12. Other layers of material, such as contact etch stop layers and the like, are not depicted in the attached drawings. Also depicted are illustrative raised epi source/drain regions 32 and source/drain contact structures 34 which typically include a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in an interlayer dielectric material. In other applications (not shown in FIG. 1B), the CA contact structures 14 may also be a line-type feature that contacts underlying line-type features, e.g., the TS structure 36 that contacts the source/drain region 20 (the TS structure 36 is a line-type feature that typically extends across the entire active region on the source/drain region 20 in a direction that is parallel to that of the gate structure 22). The TS structures 36, CA contacts 14 and the CB contact 16 are all considered to be device-level contacts within the industry.

In one embodiment, the process flow of forming the TS structures 36, CA contacts 14 and CB contacts 16 may be as follows. After the first layer of insulating material 30A is deposited, TS openings are formed in the first layer of insulating material 30A that expose portions of underlying source/drain regions 20. Thereafter, a traditional metal silicide region is formed through the TS openings, followed by forming tungsten (not separately shown) on the metal silicide regions, and performing a chemical mechanical polishing (CMP) process down to the top of the gate cap layer 24. Then, the second layer of insulating material 30B is deposited and contact openings for the CA contacts 14 are formed in the second layer of insulating material 30B that expose portions of the underlying tungsten metallization above the source/drain regions 20. Next, while the opening for the CA contacts 14 is masked, the opening for the CB contact 16 is formed in the second layer of insulating material 30B and through the gate cap layer 24 so as to expose a portion of the gate electrode 22B. Typically, the CB contact 16 may be in the form of a round or square plug. Thereafter, the conductive CA contacts 14 and the conductive CB contact 16 are formed in their corresponding openings in the second layer of insulating material 30B by performing one or more common metal deposition and CMP process operations, using the second layer of insulating material 30B as a polish-stop layer to remove excess conductive material positioned outside of the contact openings. The CA contacts 14 and CB contact 16 typically contain a uniform body of metal, e.g., tungsten, and may also include one or more metallic barrier layers (not shown) positioned between the uniform body of metal and the layer of insulating material 30B. As noted above, the source/drain contact structures 34, the CA contacts 14 and the CB contact 16 are all considered to be device-level contacts within the industry.

With continuing reference to FIG. 1A, a portion of the multi-level metallization system for the IC product 10 is depicted. More specifically, FIG. 1A depicts an illustrative example of a so-called M1 metallization layer of the multi-level metallization system. The M1 metallization layer is formed in a layer of insulating material 38, e.g., a low-k insulating material. The M1 metallization layer typically include a plurality of metal lines 42 that are routed as needed across the IC product 10. A plurality of conductive vias—so-called V0 vias 40—are formed so as to establish electrical connection between the M1 metallization layer and the device-level contacts—CA contacts 14 and the CB contact 16. The metallization lines 42 are typically formed by forming long continuous trenches in the layer of insulating material 38 across substantially the entire substrate. Thereafter, these trenches are filled with one or more conductive materials and one or more chemical mechanical polishing (CMP) processes are performed to remove excessive conductive materials located outside of the trenches.

FIG. 1B is a simplistic plan view of the illustrative transistor device 11 just showing the device level contacts—the CA contacts 14 and the CB contact 16—and their relative locations for the device 11. Also depicted in FIG. 1B is the gate cap layer 24, the sidewall spacer 26 and the trench silicide structures 36 formed above the source/drain regions 20. As noted above, the entire CB gate contact 16 is positioned vertically above the isolation region 13 that surrounds the product 10, i.e., the CB gate contact 16 is not positioned above the active region defined in the substrate 12. The CB gate contact 16 is typically positioned above the isolation region 13 so as to avoid or reduce the chances of creating an electrical short between the CB contact 16 and the TS structure 36, i.e., there is a minimum spacing 43 that must be maintained between these two structures according to various design rules in an attempt to prevent such electrical shorts. Unfortunately, there is an area penalty associated with the requirement that the CB contact 16 only be positioned above the isolation region 13. What is needed is a method for forming the CB gate contact 16 above the active region of the device so as to conserve valuable plot space on an integrated circuit product.

The present disclosure is directed to various methods of forming a gate contact for a semiconductor device above the active region and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact structure for a semiconductor device above the active region and the resulting device. One illustrative method disclosed includes, among other things, completely forming a first conductive structure comprising one of a conductive gate contact structure (CB) or a conductive source/drain contact structure (CA), wherein the entire conductive gate contact structure (CB) is positioned vertically above a portion of an active region of a transistor device, and, after completely forming the first conductive structure, completely forming a second conductive structure comprising the other of the conductive gate contact structure (CB) or the conductive source/drain contact structure (CA).

BRIEF DESCRIPTION OF THE DRAWINGS

The disclosure may be understood by reference to the following description taken in conjunction with the accompanying drawings, in which like reference numerals identify like elements, and in which.

Figure 1A:
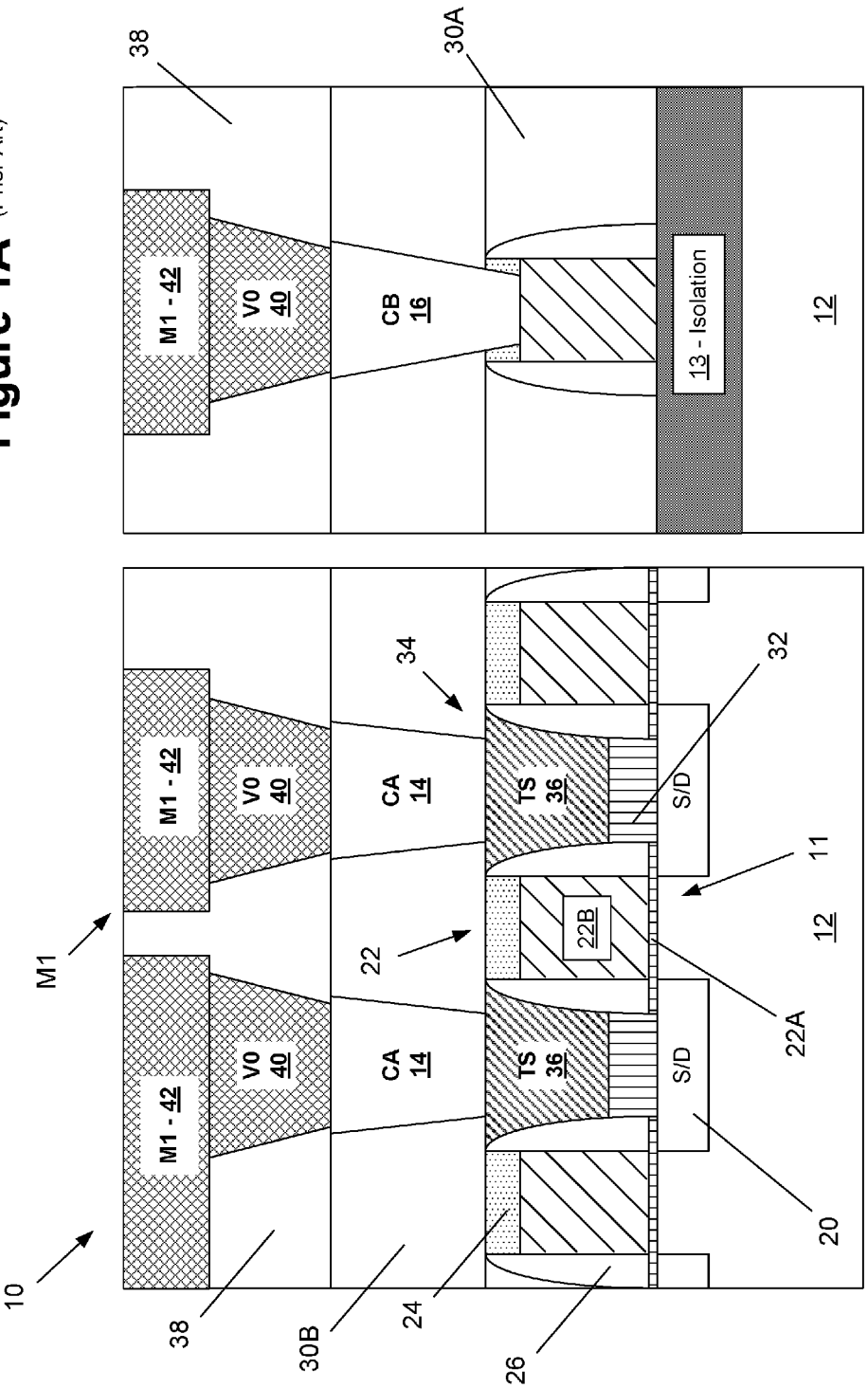
FIGS. 1A-1B depict various illustrative prior art arrangements of device-level contacts and metallization layers for an integrated circuit product.
Figure 1B:
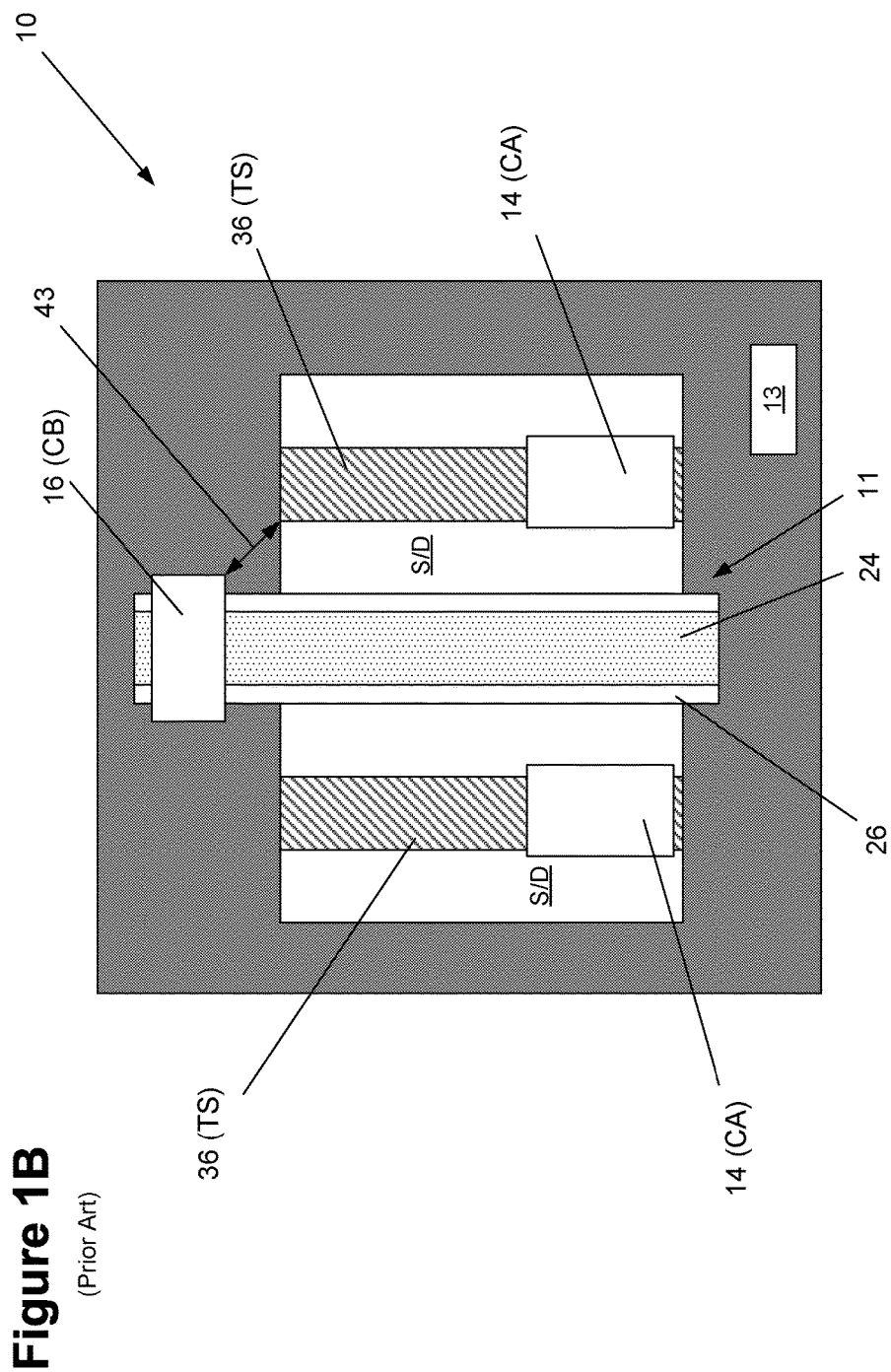

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a conductive gate contact structure (CB) above an active region of a semiconductor device and the resulting device, wherein the gate contact is positioned above the active region. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2N depict various illustrative and novel methods disclosed herein for forming a conductive gate contact structure (CB) above an active region of a semiconductor device for an integrated circuit (IC) product 100. Many of the figures contain a simplistic plan view showing where various cross-sectional views are taken in the drawings. The plan view also depicts where an illustrative conductive gate contact structure (CB) and an illustrative conductive source/drain contact structure (CA) will eventually be formed above the substrate 102. As indicated in FIG. 2A, the view X-X is a cross-sectional view taken through the device (in a direction corresponding to the gate length direction of the device) at a location where the conductive gate contact structure (CB) will eventually be formed, while the view Y-Y is a cross-sectional view taken through the device (in a direction corresponding to the gate length direction of the device) at a location where the illustrative conductive source/drain contact structure (CA) will eventually be formed. Of course, the device may comprise more than one conductive source/drain contact structure (CA), but only one is depicted so as to simplify the drawings. It should also be noted that, although some of the figures contain a plan view of the product 100, not all aspects of the processing shown in the cross-sectional views will be depicted in the plan view so as to not overly complicate the drawings.

With continuing reference to FIG. 2A, the illustrative product 100 will be formed in and above the semiconductor substrate 102. In this example, the IC product 100 comprises four illustrative laterally spaced-apart gates 101A-D (collectively referenced using the numeral 101) that were formed above the substrate 102. The product 100 may comprise either NMOS transistors, PMOS transistors or both types of transistors. The transistors may be of any desired configuration, e.g., FinFET devices, planar devices, etc. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein several process operations have been performed. First, an isolation region 103 was formed in the substrate 102 so as to define an active region (102X) where transistor devices will be formed. Next, a plurality of illustrative final gate structures 104, one for each of the gates 101, were formed above the substrate 102. Each of the gates 101 includes a schematically depicted final gate structure 104, an initial sidewall spacer 108 and a gate cap layer 106. The sidewall spacer 108 was formed by performing a conformal deposition process to form a conformal layer of spacer material, e.g., silicon nitride, above the substrate 102 and thereafter performing an anisotropic etching process. The final gate structure 104 typically includes a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The sidewall spacer 108 and the gate cap layer 106 are typically comprised of silicon nitride. The final gate structure 104 may be formed using well-known "gate first" or "replacement gate" manufacturing techniques. After the gate structures 104 were formed, an optional epi semiconductor material 114 was formed in the source/drain regions of the transistor devices. The epi semiconductor material 114 need not be formed in all applications. The physical size of the final gate structures 104 and the gate pitch for the final gate structures 104 may vary depending upon the particular application. Also depicted in FIG. 2A is layer of insulating material 110, e.g. silicon dioxide, that was deposited above the substrate 102 between the laterally spaced-apart gates 101. A planarization process (e.g., a chemical mechanical planarization (CMP) process) was performed on the layer of insulating material 110 using the gate cap layers 106 as a polish-stop. This process operation exposes the upper surface of the gate cap layers 106. Other layers of material that may be present, such as a conformal contact etch stop layer that is formed above the epi material 114, are not depicted in the drawings so as to not overly complicate the drawings.

Figure 2B:
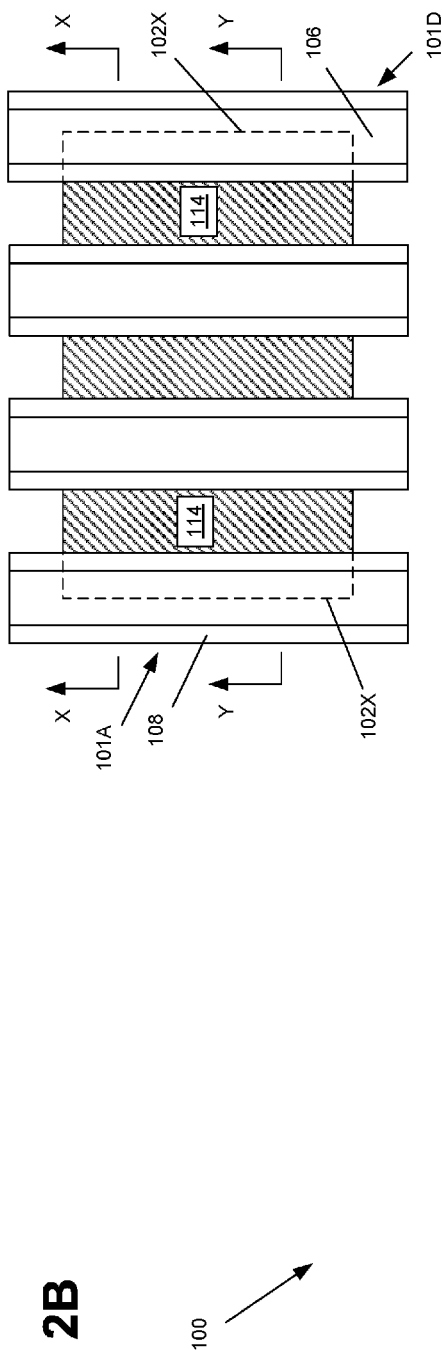
FIGS. 2A-2N depict various novel methods disclosed herein for forming a gate contact for a semiconductor device above the active region and the resulting device.
Figure 2B:
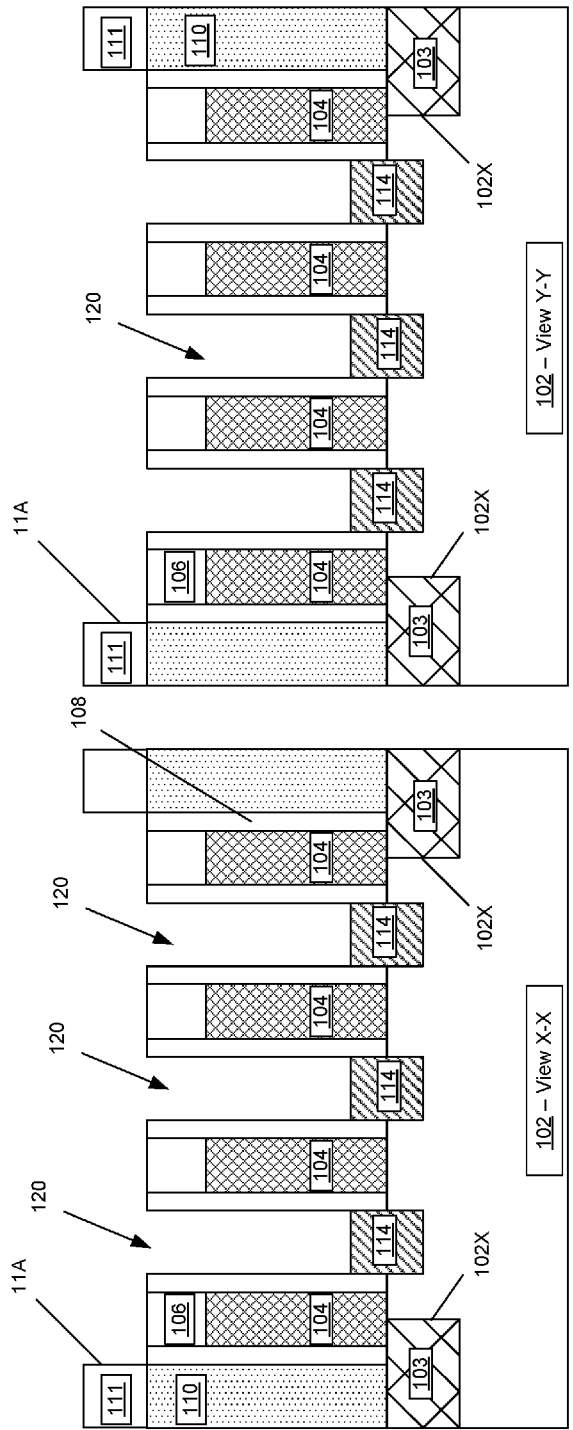

The next major operation involved forming a plurality of conductive source/drain metallization structures so as enable electrical contact with each of the individual source/drain regions of the devices. Accordingly, FIG. 2B depicts the product 100 after several process operations were performed. First, a patterned etch mask 111, with an opening 111A defined therein, was formed above the substrate 102. The opening 111A is located above the active region defined in the substrate 102. The patterned etch mask 111 may take a variety of forms and may be comprised of a variety of different materials, e.g., a layer of photoresist, an antireflective coating layer and a planarizing layer. The patterned etch mask 111 may be formed using known photolithography tools and techniques. Next, one or more etching processes was performed through the patterned etch mask 111 to selectively remove the exposed portions of the layer of insulating material 110 relative to the surrounding materials and expose the underlying source/drain regions. This process operation defines a plurality of source/drain contact cavities 120.

Figure 2C:
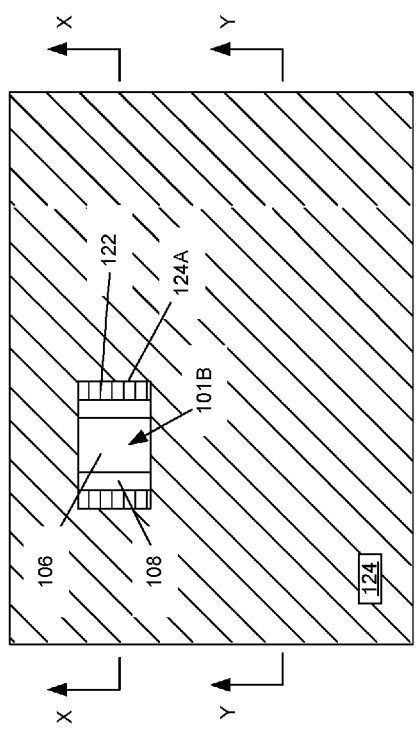
Figure 2C:
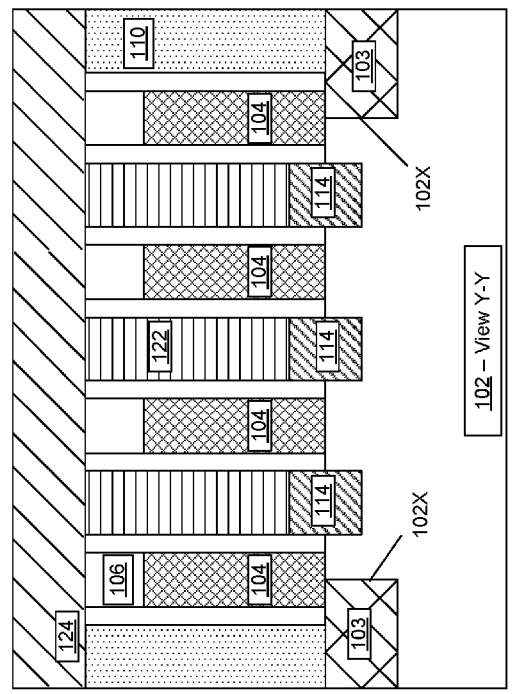
Figure 2C:
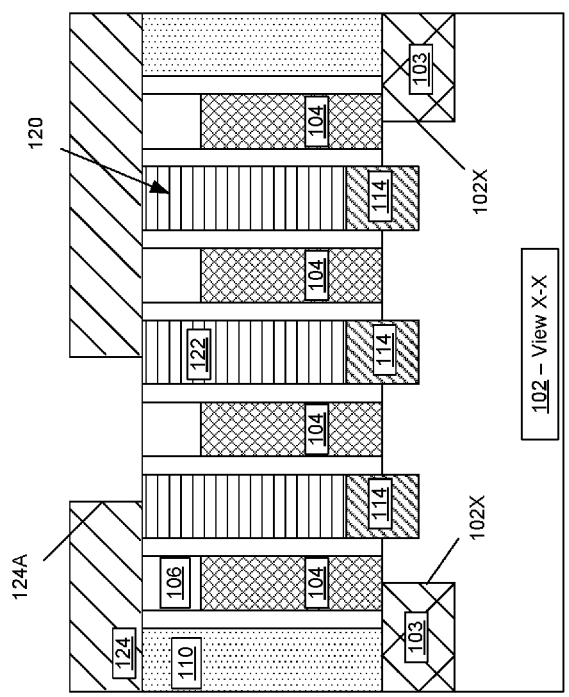

FIG. 2C depicts the product after several process operations were performed. First, the patterned etch mask 111 was removed. Then, a plurality of initial conductive source/drain metallization structures 122 were formed on the product 100 in the source/drain contact cavities 120. The initial conductive source/drain metallization structures 122, e.g., trench silicide containing regions, contact the raised epi source/drain regions 114 (the source/drain regions) and constitute the conductive source/drain metallization structures that will eventually be conductively coupled to the conductive source/drain contact structures (CA) that are to be subsequently formed on the product 100. Typically, a pre-clean process may be performed prior to forming metal silicide regions (not shown) that physically contact the raised epi material 114. Next, a simplistically depicted initial conductive source/drain metallization structure 122 was formed in each of the source/drain contact cavities 120 so as to establish contact to their respective source/drain region of the transistor devices. As noted above, the initial conductive source/drain metallization structures 122 (irrespective of their precise configuration and the manner in which they are made) provide an electrical path between the source/drain regions of the devices (including the raised epi source/drain regions 114) and the conductive source/drain contact structures (CA) that are to be subsequently formed for the product 100. The configuration and structure of the initial conductive source/drain metallization structures 122 may vary depending upon the particular application. In one example, the initial conductive source/drain metallization structures 122 are line-type structures that extend into and out of the drawing page in FIG. 2C (see views X-X and Y-Y) that extend for substantially the entire length of the active region (in a direction that corresponds to the gate width direction of the devices). In some cases, the initial conductive source/drain metallization structures 122 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the initial conductive source/drain metallization structures 122, a chemical mechanical polishing (CMP) process was performed to remove excess materials located above the upper surface of the gate cap layers 106.

With continuing reference to FIG. 2C, a patterned CB masking layer 124, e.g., OPL, photoresist, etc., was formed above the product 100. The CB masking layer 124 has an opening 124A that exposes a portion of the gate 101B at a location above the active region where the conductive gate contact structure (CB) will be formed to contact the gate structure 104 of the gate 101B. Note that portions of the line-type initial conductive source/drain metallization structures 122 positioned on opposite sides of the gate 101B are exposed by the opening 124A.

Figure 2D:
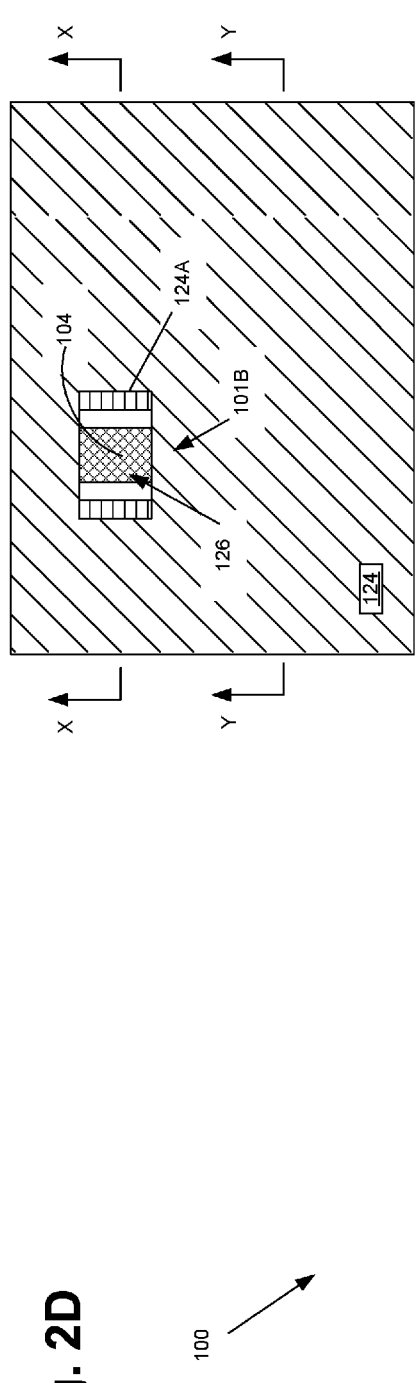
Figure 2D:
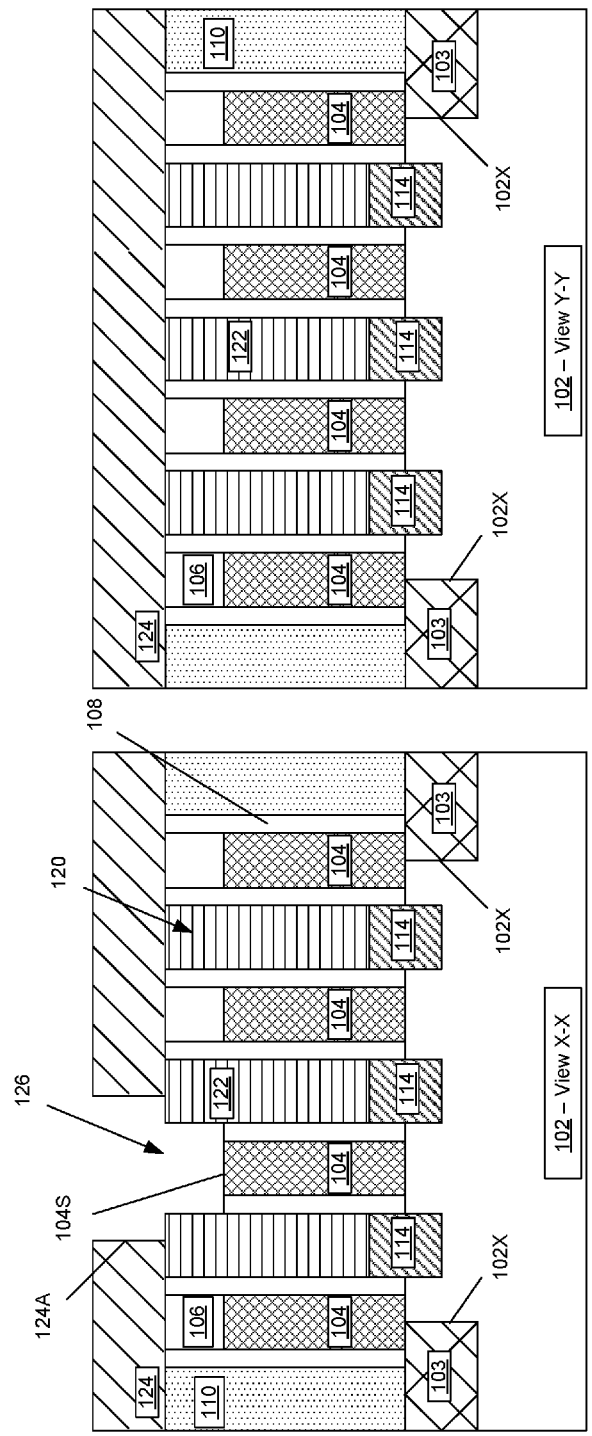

FIG. 2D depicts the product 100 after one or more etching processes were performed through the patterned CB masking layer 124 to selectively remove the exposed portions of the gate cap layer 106 and vertical portions of the initial sidewall spacer 108 for the gate 101B relative to the surrounding materials. This process operation exposes the upper surface 104S of the axial portion of the gate structure 104 positioned under the opening 124A in the patterned CB masking layer 124 and results in the definition of a gate contact cavity 126.

Figure 2E:
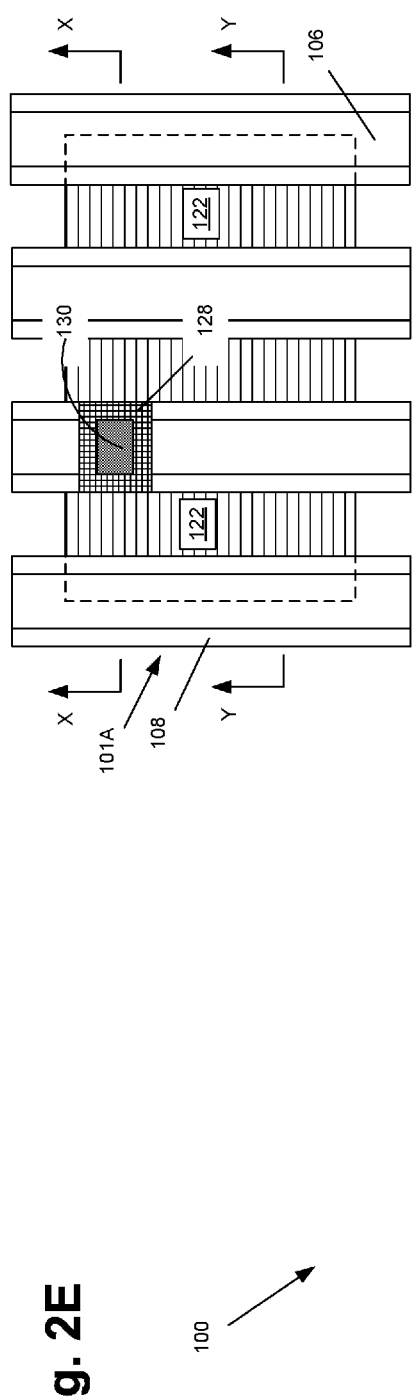
Figure 2E:
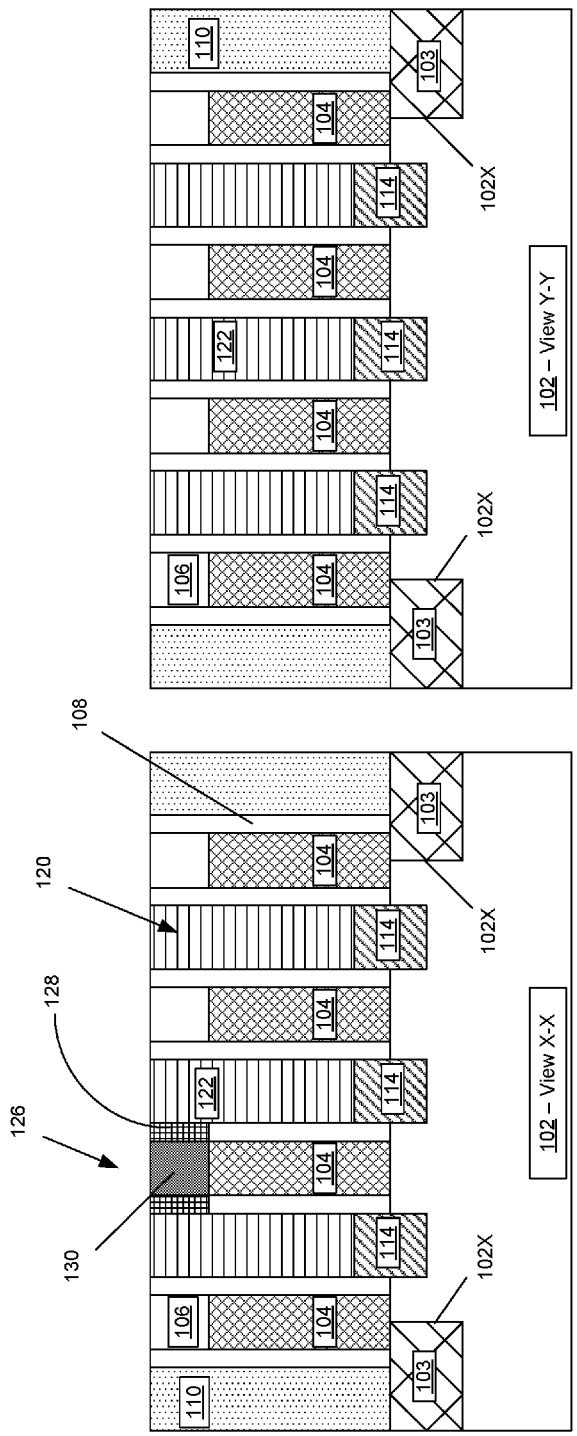

FIG. 2E depicts the product 100 after several process operations were performed. First, the patterned CB masking layer 124 was removed. Next, an internal the sidewall spacer 128 was formed in the gate contact cavity 126 adjacent the conductive source/drain metallization structures 122 and above the recessed sidewall spacer 108. The internal spacer 128 was formed by depositing a layer of spacer material, e.g., silicon nitride, in the gate contact cavity 126 and thereafter performing an anisotropic etching process on the layer of spacer material. The internal spacer 128 may or may not be comprised of the same material as that of the spacer 108, and it may have the same lateral thickness of the spacer 108 or it may have a different lateral thickness. Thereafter, a conductive gate contact (CB) structure 130 was formed in the remaining unfilled portions of the gate contact cavity 126 and inside the internal spacer 128. The conductive gate contact structure (CB) 130 may be of any desired cross-sectional configuration when viewed from above, e.g., square, rectangular, round, etc. The conductive gate contact structure (CB) 130 is intended to be schematic and representative in nature, as it may be formed using any of a variety of different conductive materials and by performing traditional manufacturing operations. The conductive gate contact structure (CB) 130 may also contain one or more barrier layers (not depicted). In one illustrative example, the conductive gate contact structure (CB) 130 may be formed by depositing a liner, e.g., Ti, TiN, followed by overfilling the gate contact cavity 126 with a conductive material, such as tungsten or cobalt. Thereafter, one or more CMP processes were performed to remove excess portions of the materials of the conductive gate contact structure (CB) 130, e.g., the liner and the tungsten (or cobalt), positioned above the gate cap layer 106 outside of the gate contact cavity 126 so as to thereby result in the formation of the conductive gate contact structure (CB) 130. Note that the conductive gate contact structure (CB) 130 is completely prevented from contacting the conductive source/drain metallization structures 122 by the internal spacer 128. Also note that, in the depicted example, an outer perimeter of the conductive gate contact structure (CB) 130 is surrounded by the internal spacer 128. Lastly, in the example shown herein, the internal spacer 128 physically contacts both the conductive gate contact structure (CB) 130 and a portion of the initial conductive source/drain metallization structures 122, as clearly shown in the cross-sectional views.

Figure 2F:
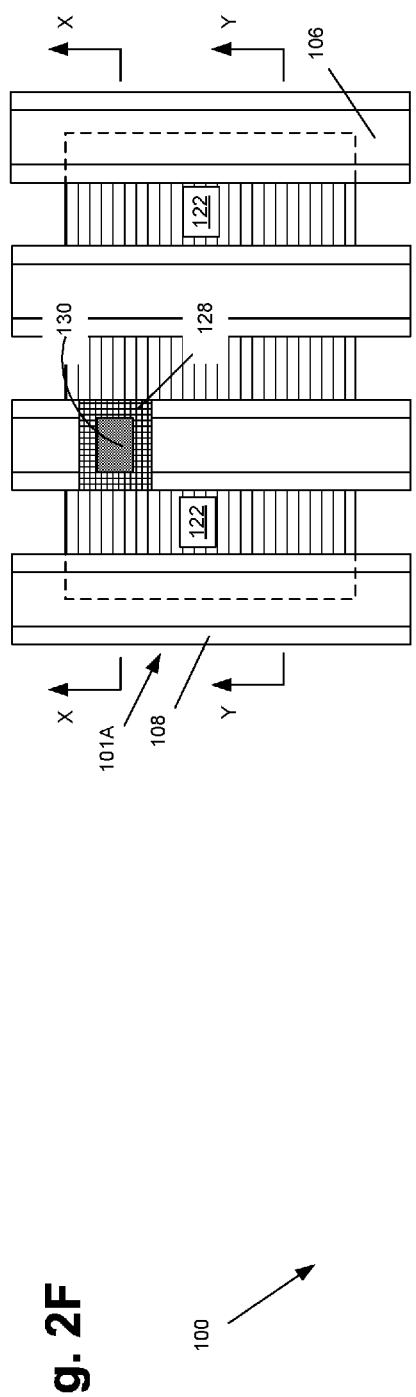
Figure 2F:
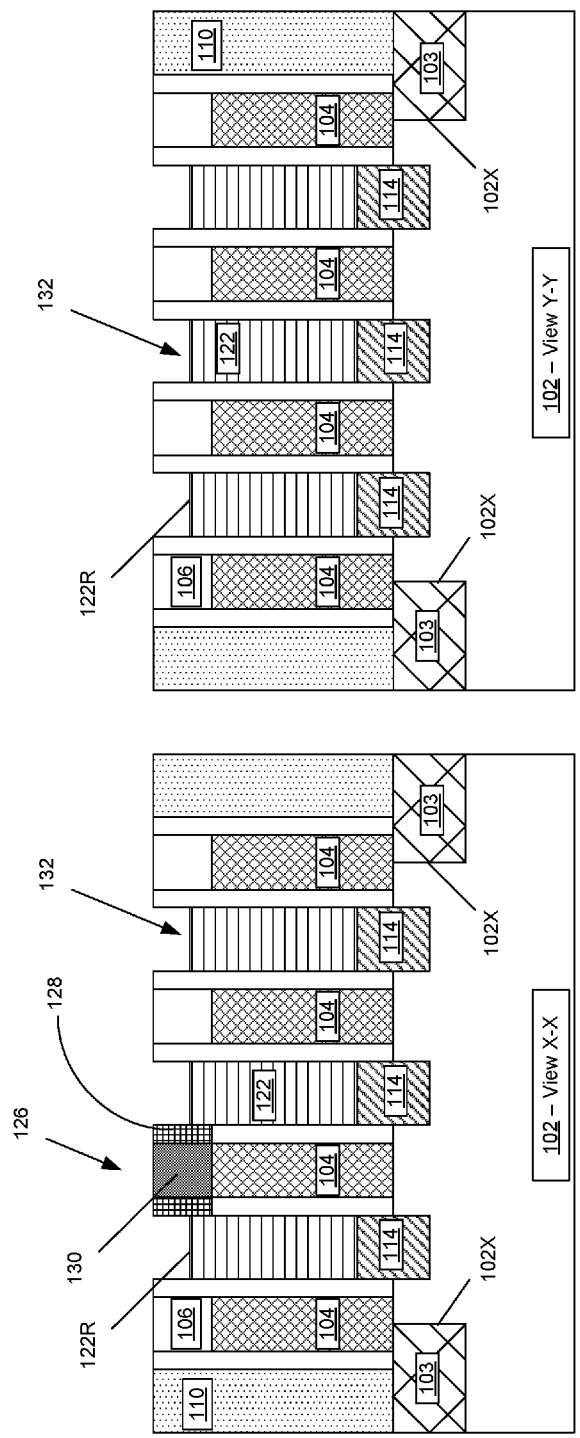

FIG. 2F depicts the product 100 after a timed, recess etching process was performed on the initial conductive source/drain metallization structures 122 so as to define a plurality of recessed conductive source/drain metallization structures 122 having a recessed upper surface 122R that is positioned at a level that is below a level of an upper surface of the conductive gate contact structure (CB) 130, e.g., by a distance of about 5-20 nm. This process operation results in the formation of a cavity 132 above each of the recessed conductive source/drain metallization structures 122. Note that, even after this recess etching process is performed, the internal spacer 128 physically contacts both the conductive gate contact structure (CB) 130 and a portion of the recessed conductive source/drain metallization structures 122, as clearly shown in the cross-sectional views.

Figure 2G:
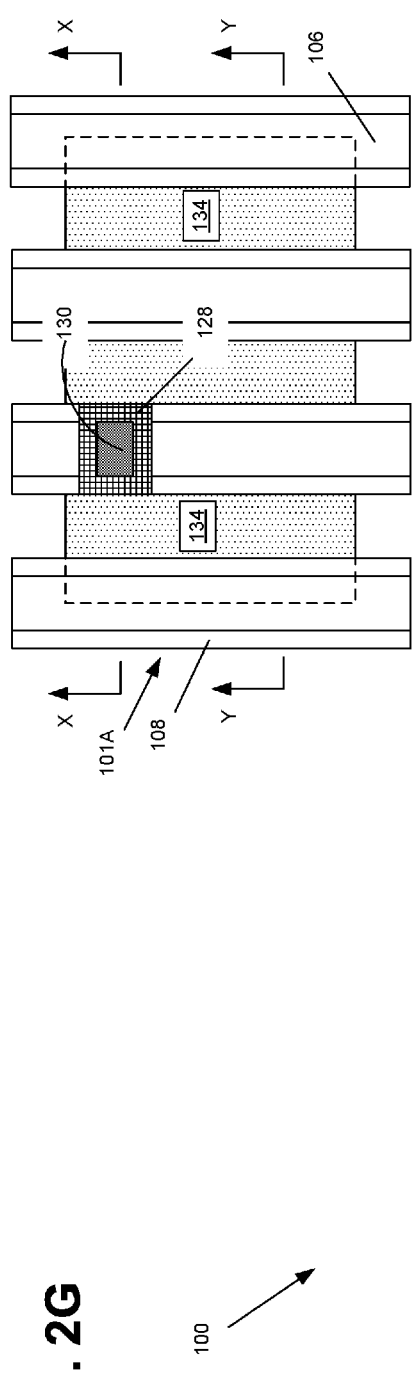
Figure 2G:
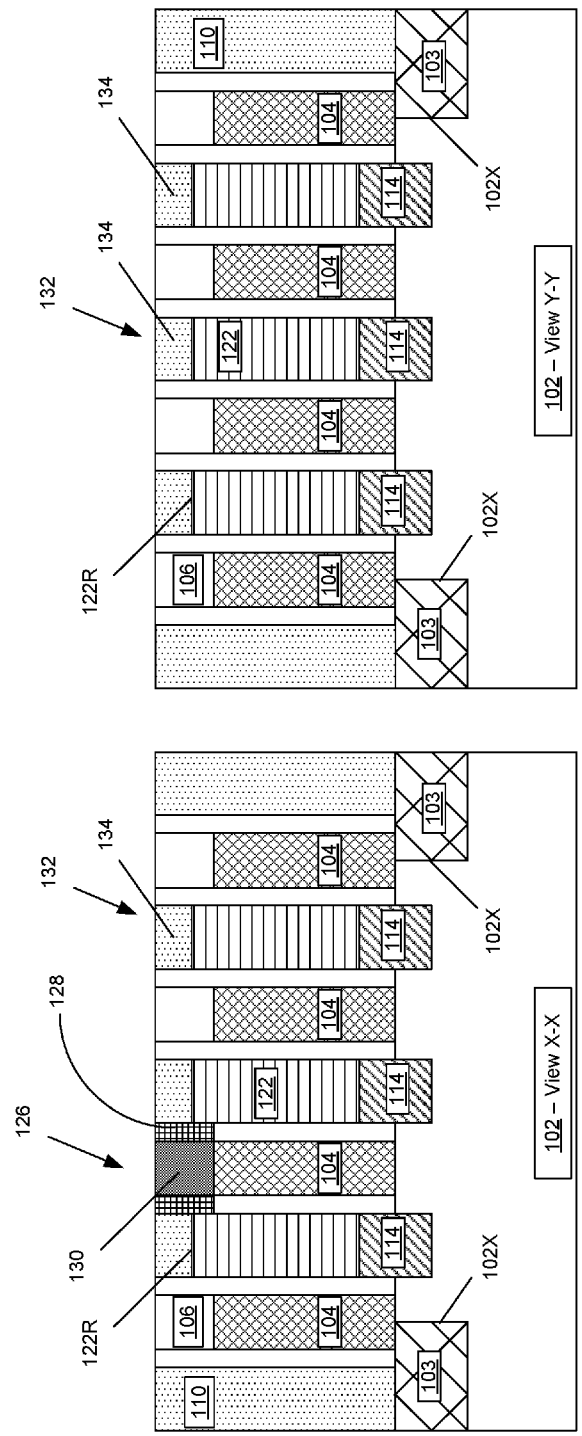

FIG. 2G depicts the product 100 after several process operations were performed. First, a layer of insulating material 134, e.g. silicon dioxide, was deposited above the substrate 102 so as to over-fill the cavities 132. Thereafter, one or more CMP processes were performed using the gate cap layers 106 as a polish-stop. This process removes excess portions of the layer of insulating material 134 positioned outside of the cavities 132. In some applications, the layer of insulating material 134 may be comprised of the same material as that of the layer of insulating material 110, but that may not be the case in all applications.

Figure 2H:
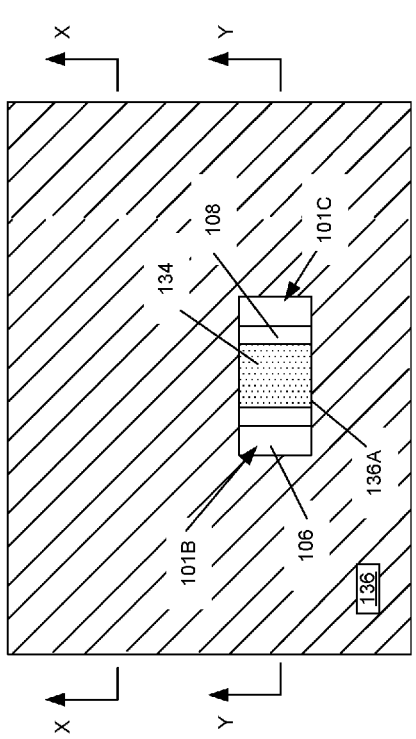
Figure 2H:
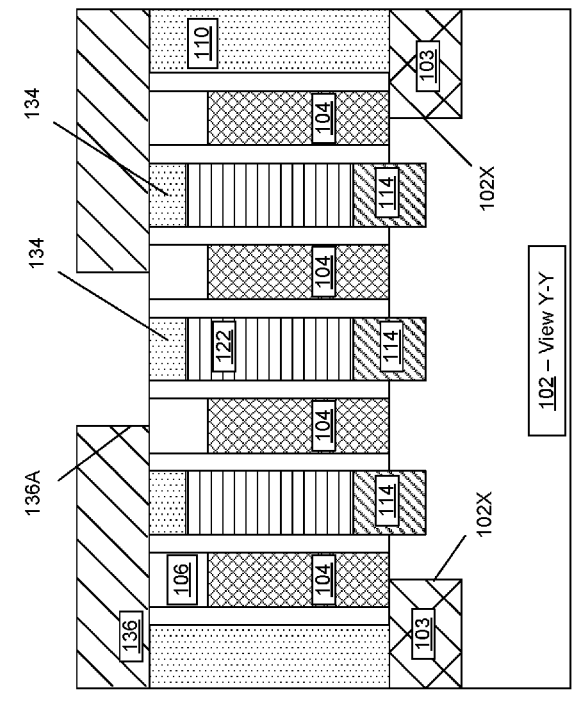
Figure 2H:
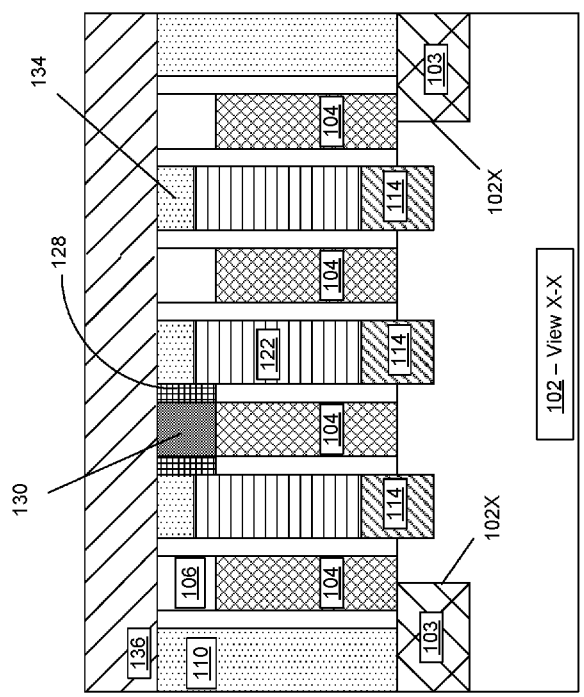

FIG. 2H depicts the product after a patterned CA masking layer 136, e.g., OPL, photoresist, etc., was formed above the product 100. The CA masking layer 136 has an opening 136A that exposes a portion of the insulating material 134 at a location between the gates 101B and 101C above the active region where the conductive source/drain contact structure (CA) will be formed to establish electrical contact to the source/drain region between the gates 101B and 101C. Note that a portion of the gate cap layers 106 and the spacer 108 for the gates 101B and 101C are exposed by the opening 136A.

Figure 2I:
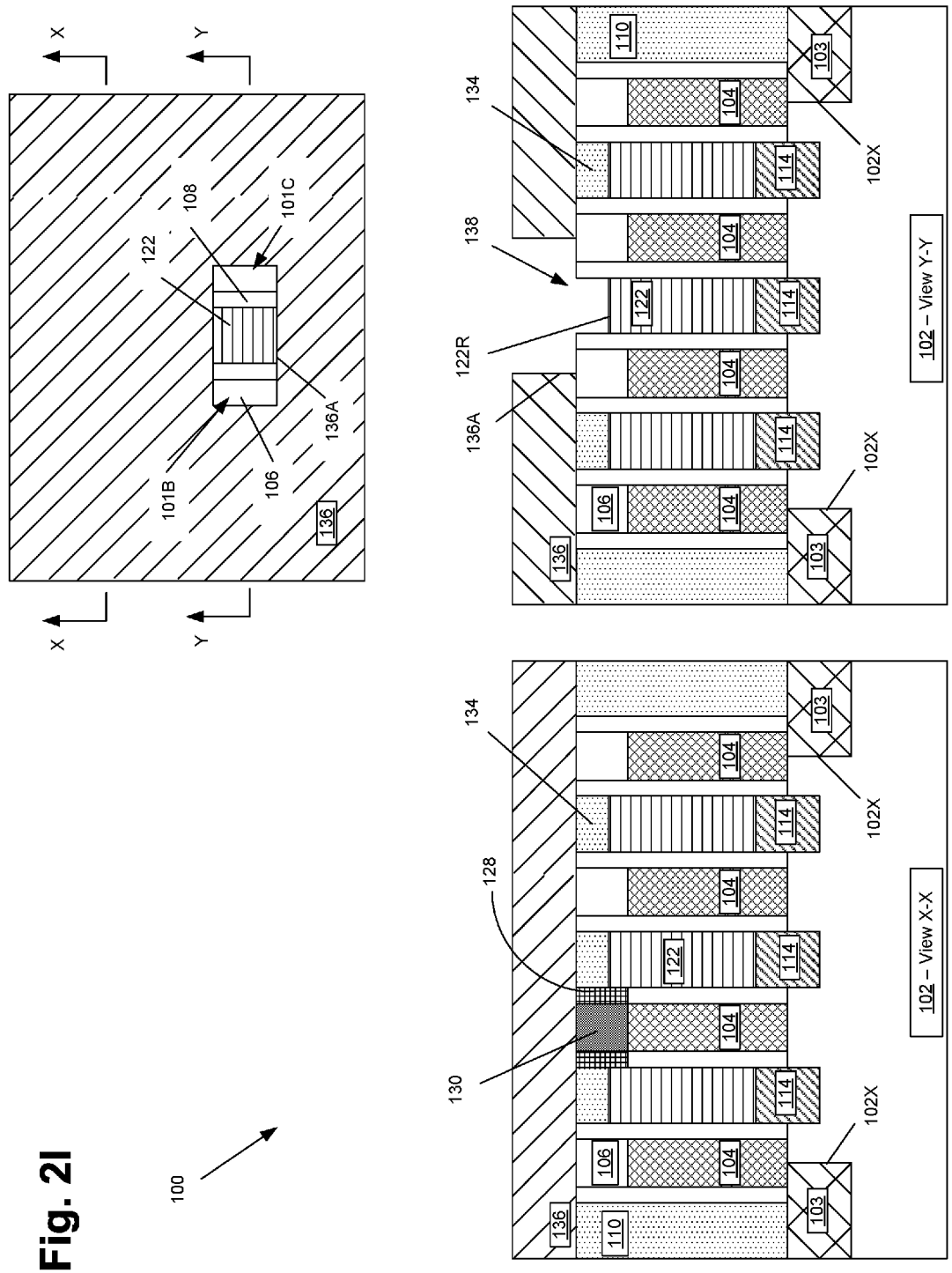

FIG. 2I depicts the product 100 after one or more etching processes were performed through the patterned CA masking layer 136 to selectively remove the exposed portions of the insulating material 134 relative to the surrounding materials. This process operation exposes the recessed upper surface of the axial portion of the recessed conductive source/drain metallization structure 122 positioned under the opening 136A in the patterned CA masking layer 136 and results in the definition of a source/drain contact cavity 138.

Figure 2J:
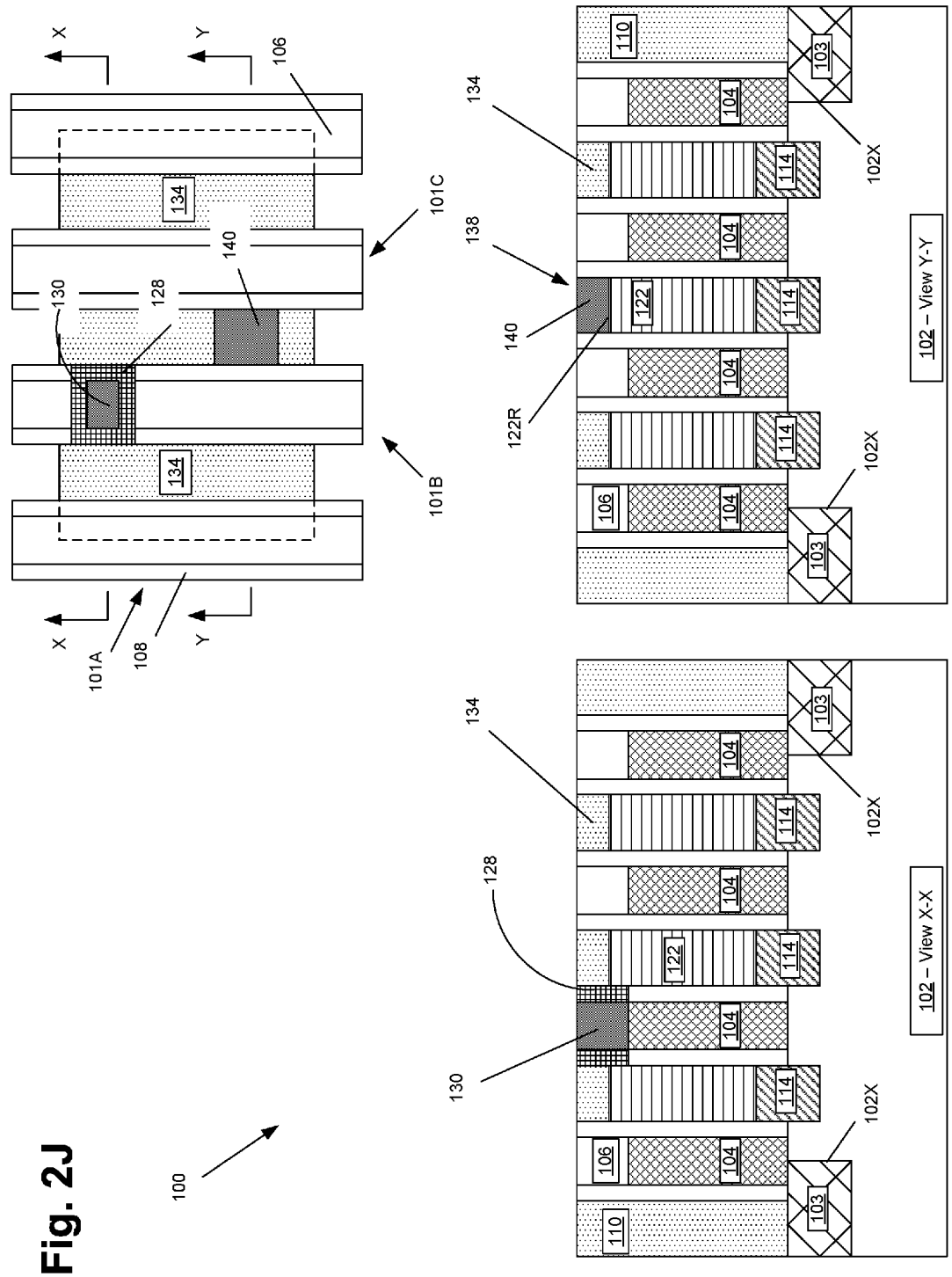

FIG. 2J depicts the product 100 after several process operations were performed. First, the patterned CA masking layer 136 was removed. Next, a conductive source/drain contact (CA) structure 140 was formed in the source/drain contact cavity 138. The conductive source/drain contact (CA) structure 140 may be of any desired cross-sectional configuration when viewed from above, e.g., square, rectangular, round, etc. The conductive source/drain contact (CA) structure 140 is intended to be schematic and representative in nature, as it may be formed using any of a variety of different conductive materials and by performing traditional manufacturing operations. The conductive source/drain contact (CA) structure 140 may also contain one or more barrier layers (not depicted). In one illustrative example, the conductive source/drain contact (CA) structure 140 may be formed by depositing a liner, e.g., Ti, TiN, followed by overfilling the source/drain contact cavity 138 with a conductive material, such as tungsten or cobalt. Thereafter, one or more CMP processes were performed to remove excess portions of the materials of the conductive source/drain contact (CA) structure 140 positioned outside of the source/drain contact cavity 138 so as to thereby result in the formation of the conductive source/drain contact (CA) structure 140. In some applications, the source/drain contact (CA) structure 140 may be comprised of the same material as that of the gate contact (CB) structure 130, but that may not be the case in all applications.

Figure 2K:
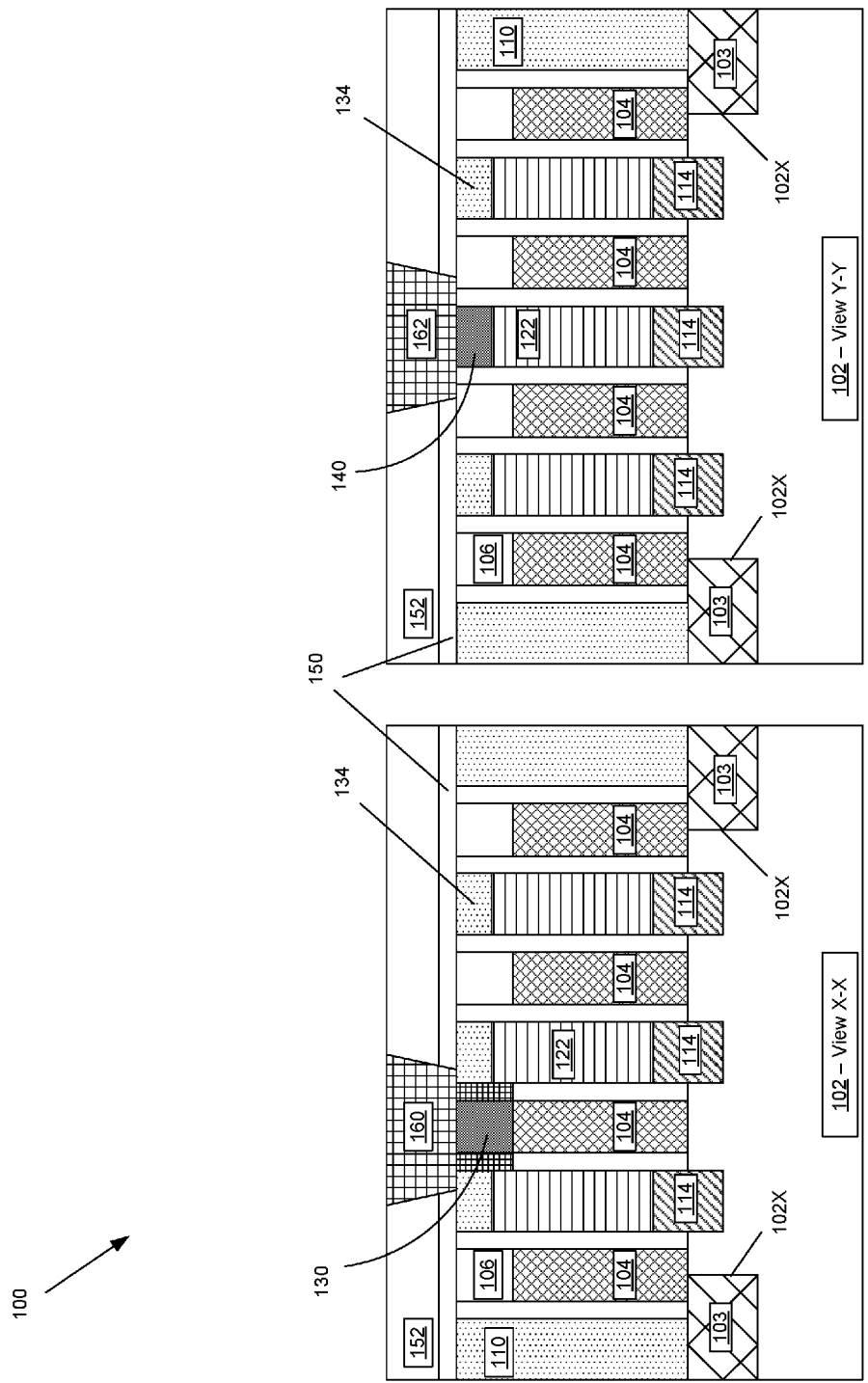

FIG. 2K depicts the product 100 after several process operations were performed. First, a layer of insulating material 150, such as silicon nitride, was deposited above the product. Thereafter, another layer of insulating material 152, e.g., silicon dioxide, a low-k insulating material, etc., was deposited above the layer 150. Next one or more etching processes were performed through a patterned etch mask (not shown) to define openings in the layers 152, 150 to expose the conductive gate contact structure (CB) 130 and the conductive source/drain contact structure (CA) 140. Thereafter, conductive V0 via structures 160, 162 were formed so as to establish electrical contact to the conductive source/drain contact structure (CA) 130 and the conductive source/drain contact structure (CA) 140, respectively. The V0 via structures 160, 162 were formed using traditional manufacturing techniques.

As will be appreciated by those skilled in the art after a complete reading of the present application, in the illustrative process flow describe above, the conductive gate contact structures (CB) 130 for the product 100 were completely formed prior to the formation of the conductive source/drain contact structures (CA) 140 for the product 100. That is, in one embodiment, the conductive gate contact structures (CB) 130 for the product were completely formed by performing a first etching-metal deposition-planarization processing sequence so as to completely form the conductive gate contact structures (CB) 130. After the conductive gate contact structures (CB) 130 were completely formed, a second etching-metal deposition-planarization processing sequence was performed so as to form the conductive source/drain contact structures (CA) 140 for the product 100. However, FIGS. 2L-2N depict an example wherein the conductive source/drain contact structures (CA) 140 for the product 100 are completely formed prior to the formation of the conductive gate contact structures (CB) 130 on the product 100.

Figure 2L:
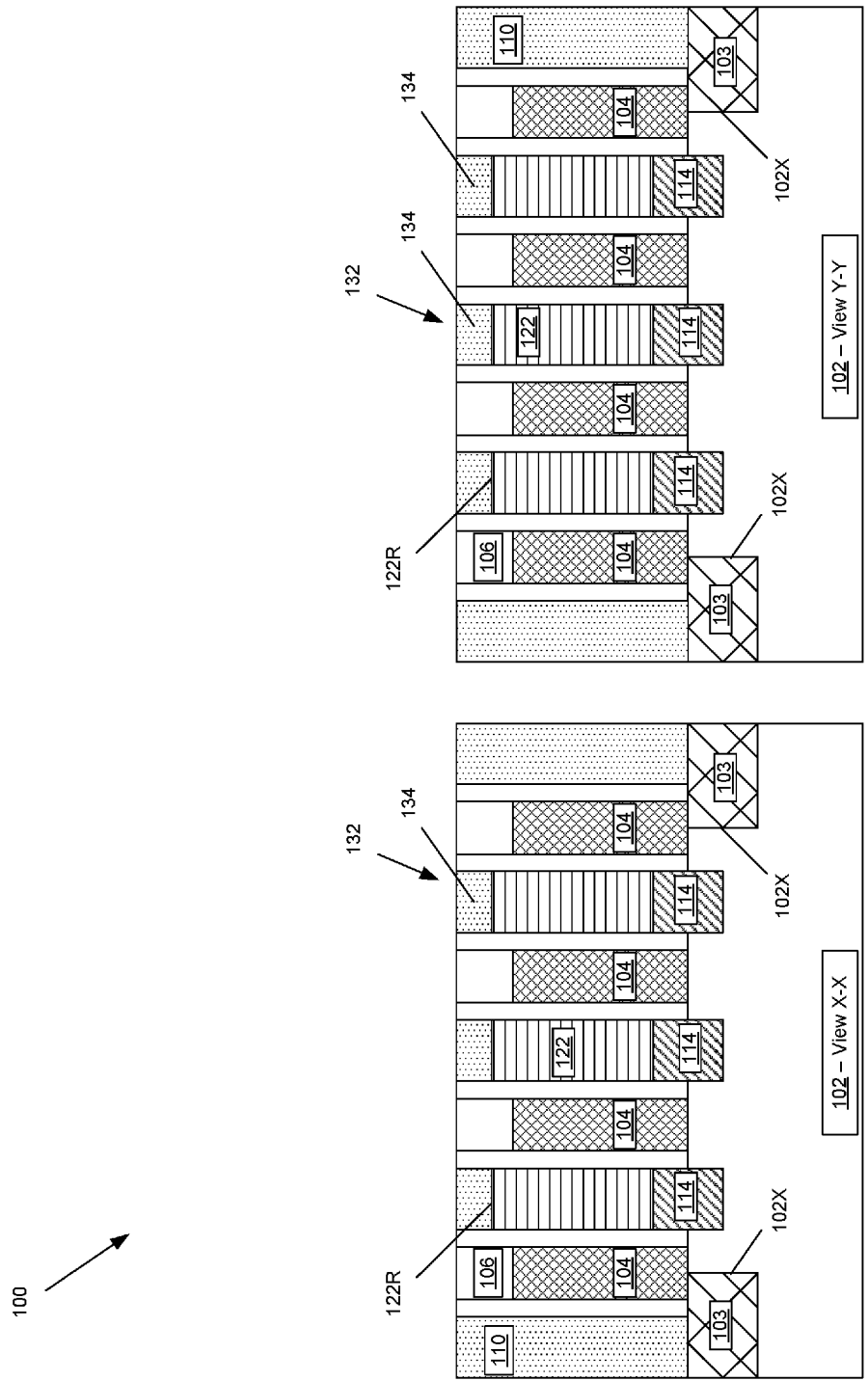

FIG. 2L depicts the product 100 after the formation of the recessed conductive source/drain metallization structures 122 and the formation of the layer of insulating material 134 in the cavities 132. FIG. 2M depicts the product 100 after the source/drain contact cavity 138 was formed by performing an etching process through the patterned CA masking layer 136 (see FIG. 2I) and after the conductive source/drain contact structure (CA) 140 was formed in the source/drain contact cavity 138 as described and discussed in connection with FIG. 2L above. FIG. 2N depicts the product 100 after several process operations were performed. First, the patterned CA masking layer 136 was removed. Next, the patterned CB masking layer 124 was formed above the product 100 as shown in FIG. 2C. The formation of the patterned CB masking layer 124 covers the previously formed source/drain contact (CA) structure 140. Thereafter, the gate contact cavity 126 was formed by performing an etching process through the patterned CB masking layer 124 (see FIG. 2D) and after the internal spacer 28 and the conductive gate contact structure (CB) 130 was formed in the gate contact cavity within the internal spacer 28 as described and discussed in connection with FIG. 2E above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive gate contact structure (CB) for a gate structure for a transistor device and a conductive source/drain contact structure (CA) for said transistor device, wherein said transistor device is formed above an active region of a semiconducting substrate surrounded by an isolation region, the method comprising:
   completely forming a first conductive structure comprising one of said conductive gate contact structure (CB) or said conductive source/drain contact structure (CA), wherein the entire first conductive structure is positioned vertically above a portion of said active region; and
   after completely forming said first conductive structure, completely forming a second conductive structure comprising the other of said conductive gate contact structure (CB) or said conductive source/drain contact structure (CA), wherein the entire second conductive structure is positioned vertically above a portion of said active region.

2. The method of claim 1, wherein completely forming said first conductive structure comprises completely forming said conductive gate contact structure (CB) and wherein completely forming said second conductive structure comprises completely forming said conductive source/drain contact structure (CA).

3. The method of claim 1, wherein completely forming said first conductive structure comprises completely forming said conductive source/drain contact structure (CA), wherein completely forming said second conductive structure comprises completely forming said conductive gate contact structure (CB), and wherein said conductive gate contact structure (CB) and said conductive source/drain contact structure (CA) comprise a same conductive material.

4. The method of claim 1, wherein completely forming said first conductive structure comprises performing a first deposition process to deposit a first conductive material for said first conductive structure and performing a first planarization process to remove portions of said first conductive material so as to define said first conductive structure.

5. The method of claim 4, wherein, after performing said first deposition process and said first planarization process, completely forming said second conductive structure comprises performing a second deposition process to deposit a second conductive material for said second conductive structure and performing a second planarization process to remove portions of said second conductive material so as to define said second conductive structure.

6. The method of claim 1, wherein an outer perimeter of said conductive gate contact structure (CB) is surrounded by a spacer comprised of an insulating material.

7. A method of forming a conductive gate contact structure (CB) for a gate structure for a transistor device and a conductive source/drain contact structure (CA) for said transistor device, wherein said transistor device is formed above an active region of a semiconducting substrate surrounded by an isolation region, the method comprising:
   performing at least one gate contact etching process through a first patterned etch mask to define a gate contact cavity that exposes a portion of said gate structure of said transistor device;
   forming an internal spacer within said gate contact cavity;
   forming said conductive gate contact structure (CB) within said gate contact cavity and inside said internal spacer, wherein said conductive gate contact structure (CB) is conductively coupled to said gate structure and wherein the entire conductive gate contact structure (CB) is positioned vertically above a portion of said active region;
   after forming said conductive gate contact structure (CB), performing at least one source/drain contact etching process through a second patterned etch mask to define a source/drain contact cavity that exposes a portion of a recessed conductive source/drain metallization structure that is conductively coupled to a source/drain region of said transistor device; and
   forming said source/drain contact structure (CA) within said source/drain contact cavity, wherein said source/drain contact structure (CA) is conductively coupled to said recessed conductive source/drain metallization structure.

8. The method of claim 7, wherein, prior to forming said internal spacer, the method further comprises removing said first patterned etch mask.

9. The method of claim 8, wherein, prior to forming said source/drain contact structure (CA), the method further comprises removing said second patterned etch mask.

10. The method of claim 7, wherein, prior to forming said source/drain contact structure (CA), the method further comprises:
    forming an initial conductive source/drain metallization structure that is conductively coupled to said source/drain region of said transistor device;
    performing a recess etching process on said initial conductive source/drain metallization structure to thereby define said recessed conductive source/drain metallization structure, wherein said recessed conductive source/drain metallization structure has a recessed upper surface that is positioned at a level that is below an upper surface of said gate contact structure (CB); and
    forming a layer of insulating material above said recessed conductive source/drain metallization structure, wherein performing said at least one source/drain contact etching process through said second patterned etch mask to define said source/drain contact cavity removes a portion of said layer of insulating material that is positioned above said recessed conductive source/drain metallization structure.

11. The method of claim 7, wherein performing said at least one gate contact etching process through said first patterned etch mask removes a portion of a gate cap layer positioned above said gate structure and recesses a vertical height of a sidewall spacer positioned adjacent said gate structure so as to thereby define said gate contact cavity.

12. The method of claim 7, wherein said conductive gate contact structure (CB) and said conductive source/drain contact structure (CA) comprise a same conductive material and wherein said transistor device is one of a FinFET transistor device or a planar transistor device.

13. The method of claim 10, wherein said internal spacer surrounds said conductive gate contact structure (CB) and physically contacts a portion of said recessed conductive source/drain metallization structure.

14. A method of forming a conductive gate contact structure (CB) for a gate structure for a transistor device and a conductive source/drain contact structure (CA) for said transistor device, wherein said transistor device is formed above an active region of a semiconducting substrate surrounded by an isolation region, the method comprising:

performing at least one gate contact etching process through a first patterned etch mask to remove a portion of a gate cap layer positioned above said gate structure and to recess a vertical height of a sidewall spacer positioned adjacent said gate structure so as to thereby define a gate contact cavity that exposes a portion of said gate structure of said transistor device;

removing said first patterned etch mask;

after removing said first patterned etch mask, forming an internal spacer within said gate contact cavity;

forming said conductive gate contact structure within said gate contact cavity and inside said internal spacer, wherein said conductive gate contact structure is conductively coupled to said gate structure and wherein the entire conductive gate contact structure (CB) is positioned vertically above a portion of said active region;

after forming said conductive gate contact structure, performing at least one source/drain contact etching process through a second patterned etch mask to define a source/drain contact cavity that exposes a portion of a recessed conductive source/drain metallization structure that is conductively coupled to a source/drain region of said transistor device;

removing said second patterned etch mask; and after removing said second patterned etch mask, forming said conductive source/drain contact structure (CA) within said source/drain contact cavity, wherein said conductive source/drain contact structure (CA) is conductively coupled to said recessed conductive source/drain metallization structure.

15. The method of claim 14, wherein, prior to forming said conductive source/drain contact structure (CA), the method further comprises:

forming an initial conductive source/drain metallization structure that is conductively coupled to said source/drain region of said transistor device;

performing a recess etching process on said initial conductive source/drain metallization structure to thereby define said recessed conductive source/drain metallization structure, wherein said recessed conductive source/drain metallization structure has a recessed upper surface that is positioned at a level that is below an upper surface of said conductive gate contact structure (CB); and forming a layer of insulating material above said recessed conductive source/drain metallization structure, wherein performing said at least one source/drain contact etching process through said second patterned etch mask to define said source/drain contact cavity removes a portion of said layer of insulating material that is positioned above said recessed conductive source/drain metallization structure.

16. The method of claim 15, wherein said internal spacer surrounds said conductive gate contact structure (CB) and physically contacts a portion of said recessed conductive source/drain metallization structure.

17. A method of forming a conductive gate contact structure (CB) for a gate structure for a transistor device and a conductive source/drain contact structure (CA) for said transistor device, wherein said transistor device is formed above an active region of a semiconducting substrate surrounded by an isolation region, the method comprising:

performing at least one source/drain contact etching process through a first patterned etch mask to define a source/drain contact cavity that exposes a portion of a recessed conductive source/drain metallization structure that is conductively coupled to a source/drain region of said transistor device;

forming said conductive source/drain contact structure (CA) within said source/drain contact cavity, wherein said conductive source/drain contact structure (CA) is conductively coupled to said recessed conductive source/drain metallization structure;

after forming said conductive source/drain contact structure (CA), performing at least one gate contact etching process through a second patterned etch mask to define a gate contact cavity that exposes a portion of said gate structure of said transistor device;

forming an internal spacer within said gate contact cavity; and forming said conductive gate contact structure (CB) within said gate contact cavity and inside said internal spacer, wherein said conductive gate contact structure (CB) is conductively coupled to said gate structure and wherein the entire gate contact structure (CB) is positioned vertically above a portion of said active region.

18. The method of claim 17, wherein, prior to forming said source/drain contact structure, the method further comprises removing said first patterned etch mask.

19. The method of claim 18, wherein, prior to forming said internal spacer, the method further comprises removing said second patterned etch mask.

20. The method of claim 17, wherein, prior to forming said conductive source/drain contact structure (CA), the method further comprises:

forming an initial conductive source/drain metallization structure that is conductively coupled to said source/drain region of said transistor device;

performing a recess etching process on said initial conductive source/drain metallization structure to thereby define said recessed conductive source/drain metallization structure, wherein said recessed conductive source/drain metallization structure has a recessed upper surface that is positioned at a level that is below an upper surface of a gate cap layer positioned above said gate structure; and forming a layer of insulating material above said recessed conductive source/drain metallization structure, wherein performing said at least one source/drain contact etching process through said first patterned etch mask to define said source/drain contact cavity removes a portion of said layer of insulating material that is positioned above said recessed conductive source/drain metallization structure.

21. The method of claim 17, wherein performing said at least one gate contact etching process through said second patterned etch mask removes a portion of a gate cap layer positioned above said gate structure and recesses a vertical height of a sidewall spacer positioned adjacent said gate structure so as to thereby define said gate contact cavity.

22. The method of claim 17, wherein said internal spacer surrounds said conductive gate contact structure (CB) and physically contacts a portion of said recessed conductive source/drain metallization structure.

23. A method of forming a conductive gate contact structure (CB) for a gate structure for a transistor device and a conductive source/drain contact structure (CA) for said transistor device, wherein said transistor device is formed above an active region of a semiconducting substrate surrounded by an isolation region, the method comprising:

performing at least one source/drain contact etching process through a first patterned etch mask to define a source/drain contact cavity that exposes a portion of a recessed conductive source/drain metallization structure that is conductively coupled to a source/drain region of said transistor device;

removing said first patterned etch mask;

after removing said first patterned etch mask; forming said conductive source/drain contact structure (CA) within said source/drain contact cavity, wherein said conductive source/drain contact structure (CA) is conductively coupled to said recessed conductive source/drain metallization structure;

after forming said conductive source/drain contact structure (CA), performing at least one gate contact etching process through a second patterned etch mask to remove a portion of a gate cap layer positioned above said gate structure and to recess a vertical height of a sidewall spacer positioned adjacent said gate structure so as to thereby define a gate contact cavity that exposes a portion of said gate structure of said transistor device;

removing said second patterned etch mask;

after removing said second patterned etch mask, forming an internal spacer within said gate contact cavity; and forming said conductive gate contact structure (CB) within said gate contact cavity and inside said internal spacer, wherein said conductive gate contact structure (CB) is conductively coupled to said gate structure and wherein the entire conductive gate contact structure (CB) is positioned vertically above a portion of said active region.

24. The method of claim 23, wherein, prior to performing at least one source/drain contact etching process, the method further comprises:

forming an initial conductive source/drain metallization structure that is conductively coupled to said source/drain region of said transistor device;

performing a recess etching process on said initial conductive source/drain metallization structure to thereby define said recessed conductive source/drain metallization structure, wherein said recessed conductive source/drain metallization structure has a recessed upper surface that is positioned at a level that is below an upper surface of a gate cap layer positioned above said gate structure; and forming a layer of insulating material above said recessed conductive source/drain metallization structure, wherein performing said at least one source/drain contact etching process through said first patterned etch mask to define said source/drain contact cavity removes a portion of said layer of insulating material that is positioned above said recessed conductive source/drain metallization structure.

25. The method of claim 24, wherein said internal spacer surrounds said conductive gate contact structure (CB) and physically contacts a portion of said recessed conductive source/drain metallization structure.

* * * * *